United States Patent
Yoshizawa

(10) Patent No.: US 7,149,487 B2
(45) Date of Patent: Dec. 12, 2006

(54) MOBILE COMMUNICATION TERMINAL DEVICE AND VARIABLE GAIN CIRCUIT

(75) Inventor: Atsushi Yoshizawa, Kanagawa (JP)

(73) Assignee: Sony Ericsson Mobile Communications Japan, Inc., Tokyo (JP)

( * ) Notice: Subject to any disclaimer, the term of this patent is extended or adjusted under 35 U.S.C. 154(b) by 412 days.

(21) Appl. No.: 10/740,210

(22) Filed: Dec. 18, 2003

(65) Prior Publication Data
US 2004/0132420 A1    Jul. 8, 2004

(30) Foreign Application Priority Data
Dec. 19, 2002    (JP)    ............ P2002-367447

(51) Int. Cl.
*H04B 1/06*    (2006.01)
(52) U.S. Cl. .............. 455/234.1; 455/235.1; 455/296; 375/345; 375/346
(58) Field of Classification Search ......... 455/232.1, 455/234.1, 234.2, 235.1, 296, 67.13; 375/345, 375/346, 351; 330/177
See application file for complete search history.

(56) References Cited

U.S. PATENT DOCUMENTS

| | | | | |
|---|---|---|---|---|
| 5,196,806 A * | 3/1993 | Ichihara | ............ | 330/137 |
| 5,220,219 A * | 6/1993 | Barber | ............ | 327/350 |
| 5,831,456 A * | 11/1998 | Sutardja | ............ | 327/100 |
| 6,055,118 A * | 4/2000 | Du | ............ | 360/46 |
| 6,420,934 B1 * | 7/2002 | Butler et al. | ............ | 330/279 |
| 2002/0127990 A1 * | 9/2002 | Bollenbeck | ............ | 455/293 |
| 2004/0116092 A1 * | 6/2004 | Hessel et al. | ............ | 455/232.1 |
| 2004/0119290 A1 * | 6/2004 | Dietz et al. | ............ | 290/1 R |

* cited by examiner

Primary Examiner—Quochien B. Vuong
Assistant Examiner—Christian A. Hannon
(74) Attorney, Agent, or Firm—Frommer Lawrence & Haug LLP; William S. Frommer; Thomas F. Presson

(57) ABSTRACT

In receiver systems for cellular phones using the W-CDMA method, the change in DC voltage occurring when the gain of a programmable gain amplifier (PGA circuit) is switched to adjust the gain for a received signal, can be suppressed. A sample-and-hold circuit is installed containing a "sample" mode for directly outputting a signal from the PGA section and also containing a "hold" mode for outputting the electric charge of a specified voltage stored in a capacitor. This sample-and-hold circuit normally operates in "sample" mode so the output signal from the PGA section is directly output, but is operated in "hold" mode at the gain switching timing of the PGA circuit, so that the electric charge of the specified voltage stored in the capacitor is output for a specified length of time (equal to the time required for the DC voltage change to converge to a stable level).

7 Claims, 7 Drawing Sheets

MOBILE COMMUNICATION TERMINAL DEVICE AND VARIABLE GAIN CIRCUIT

BACKGROUND OF THE INVENTION

1. Field of the Invention

The present invention relates to a mobile communication terminal device and a variable gain circuit that is preferably installed, for example, in cellular phones compatible with the W-CDMA (Wideband-Code Division Multiple Access) method, PHS (Personal Handyphone System) phones or PDA (Personal Digital(Data) Assistants) having wireless communication capability.

2. Description of Related Art

The received power level distribution of antennas used in modern cellular phones spans a wide range from 80 dB to 100 dB. To cope with this, cellular phone receivers use an automatic gain control circuit (AGC circuit) that adjusts the signals received over this wide range to an optimum level so that the appropriate signals are transferred to the baseband A/D converter.

Analog control type circuits (VGA circuit: voltage-controlled gain amplifier) have been commonly used as AGC circuits to adjust the voltage serving as the control signal and use it to control the gain. Recently, however, digital control type circuits (PGA circuit: programmable gain amplifier) are being widely used that supply digital data as the control signal and control the gain discretely.

A typical PGA circuit is shown in FIG. 7. This PGA circuit is also capable of changing the gain of a PGA section 101, for example, in one decibel steps or from a minimum gain up to the maximum gain one step at a time, by supplying gain control information to each stage of a PGA section 101 from a gain control circuit 100 based on 3-wire signals (data signal, clock signal, and latch signal).

In this type of PGA circuit, when the PGA section 101 is controlled to a high gain, the self-offset DC voltage at each stage in the PGA section 101 is also amplified so that the output DC level reaches the reference voltage level (VDD level) or ground level (GND level) and the PGA circuit eventually saturates. Normal operation of the PGA circuit cannot be expected during this saturated state.

To solve this problem, a DC feedback circuit 102 is installed in this PGA circuit as shown in FIG. 7. This DC feedback circuit 102 detects direct current components (DC components) in the output signal, inverts the phase of the detected signal, and adds the detected signal to the input signal (negative feedback) by using an adder 103. This feedback process cancels out the change in the self-offset DC voltage and stabilizes the direct current value in this PGA circuit. Problems with PGA circuit saturating are in this way prevented.

When using this type of PGA circuit as a baseband amplifier for cellular phones, the cutoff frequency of a low-pass filter used as the DC feedback circuit 102 must be set to an extremely low value. If the cutoff frequency is not set to an extremely low value, then a lack of low frequency components in the input-to-output signal transfer characteristics will increase to a level that is not acceptable for baseband amplifiers.

However, the cutoff frequency level and the time constant of this DC feedback circuit 102 are in a trade-off relationship with each other. As the cutoff frequency is set lower, the time constant becomes larger. This creates the problem that time (DC voltage convergence time) is required for the DC voltage change to converge to the initial level.

More specifically, when the gain is switched, the DC voltage greatly varies at that gain switching timing as shown in FIG. 8. Also the time required for the DC voltage change to converge to the initial DC voltage will be longer when the cutoff frequency is set to a low value.

To shorten this DC voltage convergence time, a band switching signal is supplied to the DC feedback circuit 102 at the timing when the gain is switched as shown in FIG. 9. This band switching signal switches and controls the cutoff frequency that has been set at a low level, so that the cutoff frequency temporarily changes to a higher level. This also temporarily reduces the time constant of the DC feedback circuit 102 so that DC voltage convergence time can be shortened as shown in FIG. 10.

A variable gain amplifier system well known in the related art as a PGA circuit is disclosed in JP-A No. 36358/2001.

As stated above, the DC voltage convergence time can be shortened by switching the cutoff frequency of the DC feedback circuit 102. However, there is still the problem that merely changing the cutoff frequency will not control the large change in DC voltage that occurs immediately after the gain is switched. This large change in DC voltage might hinder stable operation in latter stages downstream of the PGA circuit.

SUMMARY OF THE INVENTION

In view of the above-mentioned problems with the related art, the present invention aims at providing a mobile communication terminal device and variable gain circuit that ensure stable operation of latter-stage circuits downstream of the PGA circuit, by controlling the large change in DC voltage occurring at the timing when the PGA circuit gain is switched.

In one preferred aspect of the present invention, the received signal amplified by the gain amplifier means is directly output in the period up until the gain of the variable gain amplifier means is switched, and a signal at a specified voltage is output for a specified length of time at the gain switching timing of the variable gain amplifier means, instead of outputting the received signal amplified by the gain amplifier means.

More specifically, since a large change in the direct-current voltage occurs immediately after the gain is switched, the signal is output at the specified voltage in the period that the direct current converges so that the change in direct-current voltage can be suppressed, instead of outputting the received signal amplified by the gain amplifier means.

Other and further objects, features and advantages of the invention will appear more fully from the following description.

DETAILED DESCRIPTION OF THE PREFERRED EMBODIMENTS

[First Embodiment]

The present invention can be applied to cellular phones compatible with the W-CDMA (DS-CDMA: Direct Spread Code Division Multiple Access) method.

[Overview of signal processing in cellular phones]

Figure 1:
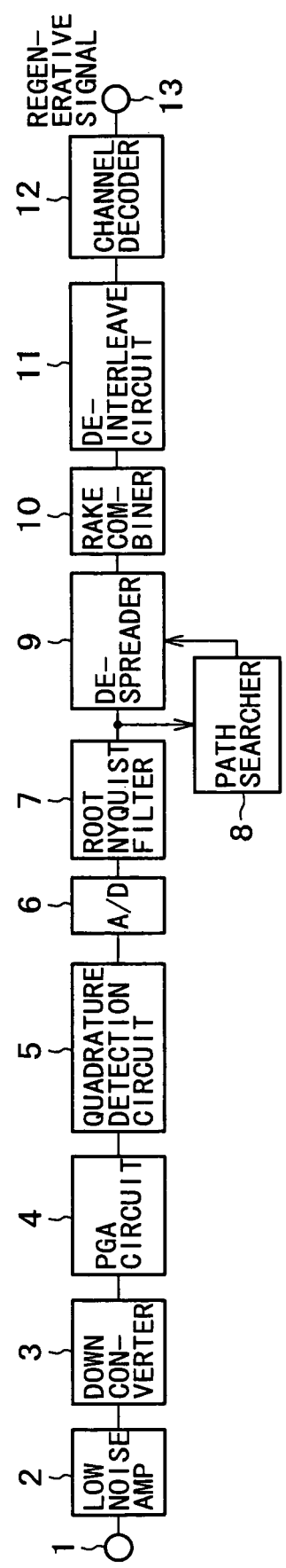
FIG. 1 is a block diagram showing the cellular phone receiver system of a first embodiment of the present invention.

FIG. 1 is a block diagram showing the cellular phone receiver system of a first embodiment of the present invention. As this figure shows, the signal received by an antenna is first amplified by a low-noise amplifier 2 via an input terminal 1. The amplified signal is then linearly amplified by a programmable gain amplifier (PGA) 4 after being converted to an intermediate frequency (IF frequency) by a down converter 3.

This linearly amplified received signal is processed by a quadrature detection circuit 5 and separated into an in-phase component and a quadrature component. The separated components are respectively converted into digital signals by an A/D converter 6. These digitalized in-phase components and quadrature components are passed through a root nyquist filter 7 to have a specified limited bandwidth, are despread by a despreader 9 based on the received power detected by a path searcher 8, and time-divided into multiple path components having different propagation delay times.

These time-divided paths are coherently rake-combined by a rake combiner 10. The data string after this rake combination is de-interleaved by a de-interleave circuit 11. The de-interleaved data string is then channel-decoded (error correction decoding) by a channel recorder 12 so that it is set as the regenerative data string which is then transferred to an upper layer via an output terminal 13.

The present invention is applicable to cellular phones and PGA circuits utilizing the above-mentioned embodiment.

[PGA circuit configuration]

Figure 2:
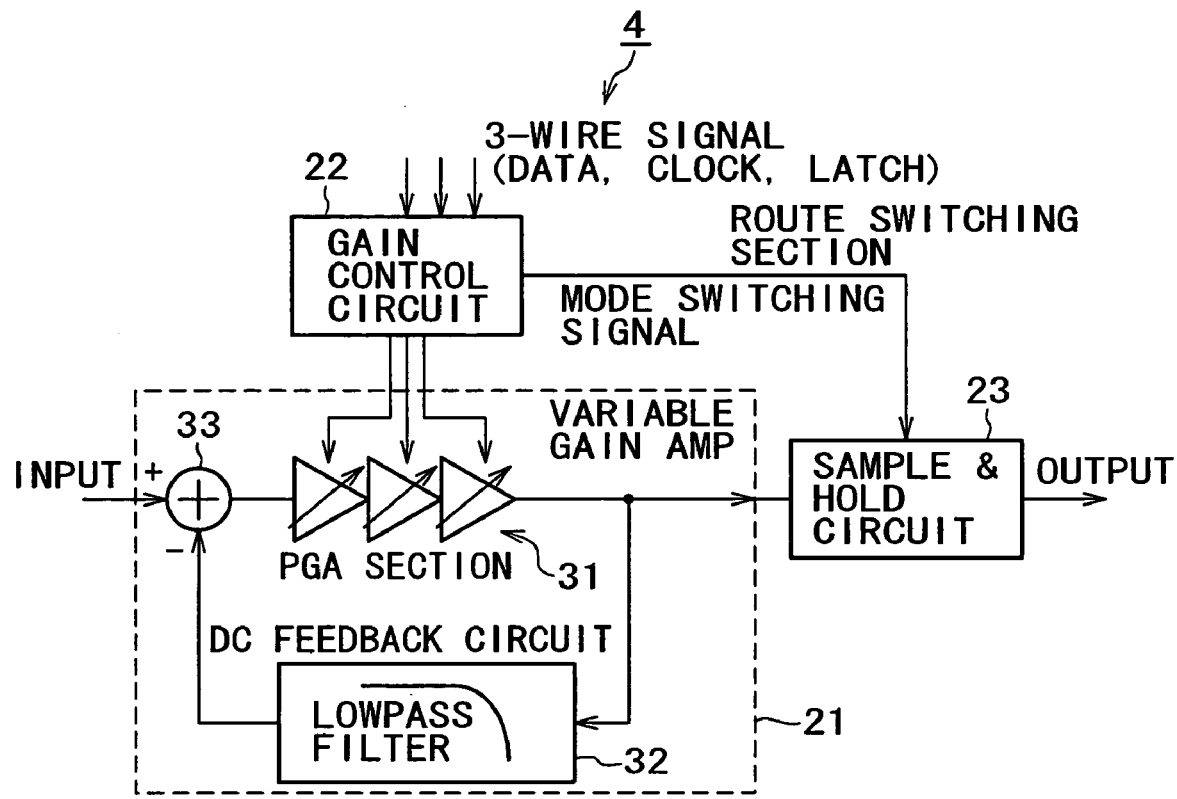
FIG. 2 is a block diagram showing the PGA circuit built into the cellular phone of the first embodiment of the present invention.

A block diagram of the PGA circuit 4 is next shown in FIG. 2. This PGA circuit 4 has a variable gain amplifier 21 that is set at a variable controlled gain to amplify a received signal converted to an intermediate frequency by the down converter 3 and outputs the amplified received signal. The PGA circuit 4 also has a gain control circuit 22 that controls the gain of the variable gain amplifier 21 based on 3-wire signals (data signal, clock signal, and latch signal) as well as outputting a mode switching signal at the gain switching timing.

This PGA circuit further has a sample-and-hold circuit 23 that directly outputs the output signal from the variable gain amplifier 21 (sample mode) according to the mode switching signal supplied from the gain control circuit 22, or outputs a signal at a specified voltage (hold mode) instead of the output signal from the variable gain amplifier 21.

The variable gain amplifier 21 has a multi-stage programmable gain amplifier section (PGA section) 31 whose gain can be controlled by the gain control circuit 22 and a DC feedback circuit 32 that detects the DC component in the output signal from the PGA section 31, inverts the phase of the DC component, and outputs it.

This variable gain amplifier 21 has an adder 33 that cancels out the DC component change in the received signal. This cancellation is performed by adding the received signal converted to an intermediate frequency by the down converter 3, to the DC component of the output signal supplied from the PGA section 31 and converted to the opposite phase by the DC feedback circuit 32, and this received signal is then supplied to the PGA section 31.

Figure 3:
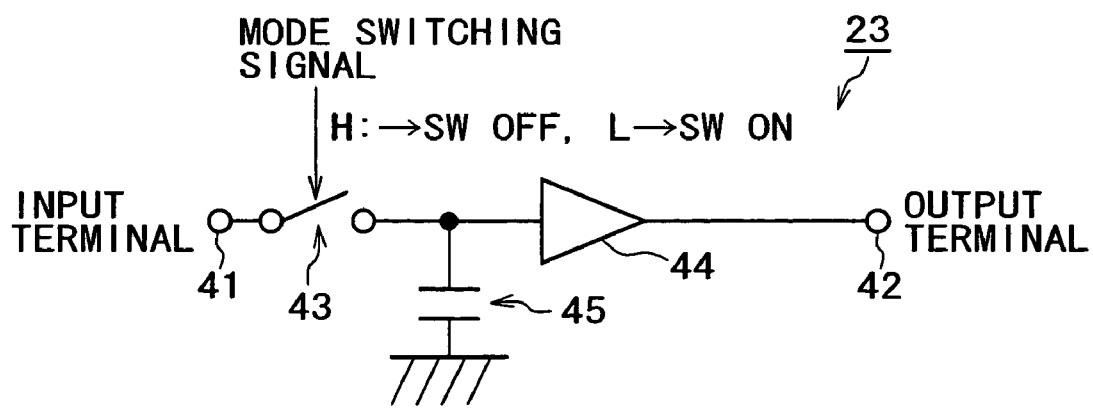
FIG. 3 is a sample-and-hold circuit used in the PGA circuit of FIG. 2.

As shown in FIG. 3, the sample-and-hold circuit 23 is configured by connecting a selector switch 43 and a high input impedance buffer 44 in series, at a point between an input terminal 41 where the output signal from the variable gain amplifier 21 is supplied, and an output terminal 42 of the sample-and-hold circuit 23 is connected to the input terminal of the quadrature detection circuit 5. The sample-and-hold circuit 23 is also configured by connecting a capacitor 45 of a specified capacity at a point between the ground and the selector switch 43 and the high input impedance buffer 44.

In this sample-and-hold circuit 23, the switch 43 turns off for a specified length of time when a high-level (H) mode switching signal is fed to the selector switch 43, and the electric charge stored in the capacitor 45 is then output instead of outputting a signal from the variable gain amplifier 21 (hold mode).

On the other hand, the selector switch 43 of this sample-and-hold circuit 23 turns on when a low-level (L) mode switching signal is fed to the selector switch 43, and the output signal from the variable gain amplifier 21 is directly output (sample mode).

[PGA circuit operation]

The operation of the PGA circuit 4 is next described in detail. In FIG. 2, the 3-wire signals are serial data consisting of a data signal, clock signal, and latch signal. The data signal is sequentially supplied to a shift register (not shown in the figure) and shaped in the gain control circuit 22 at the clock signal timing.

The gain is switched at the timing of the latch signal. Specifically, the data signal supplied to the shift register is fed in parallel to each stage of the PGA section 31 as the gain control signal, so that the gain of the PGA section 31 can be controlled.

Figure 4:
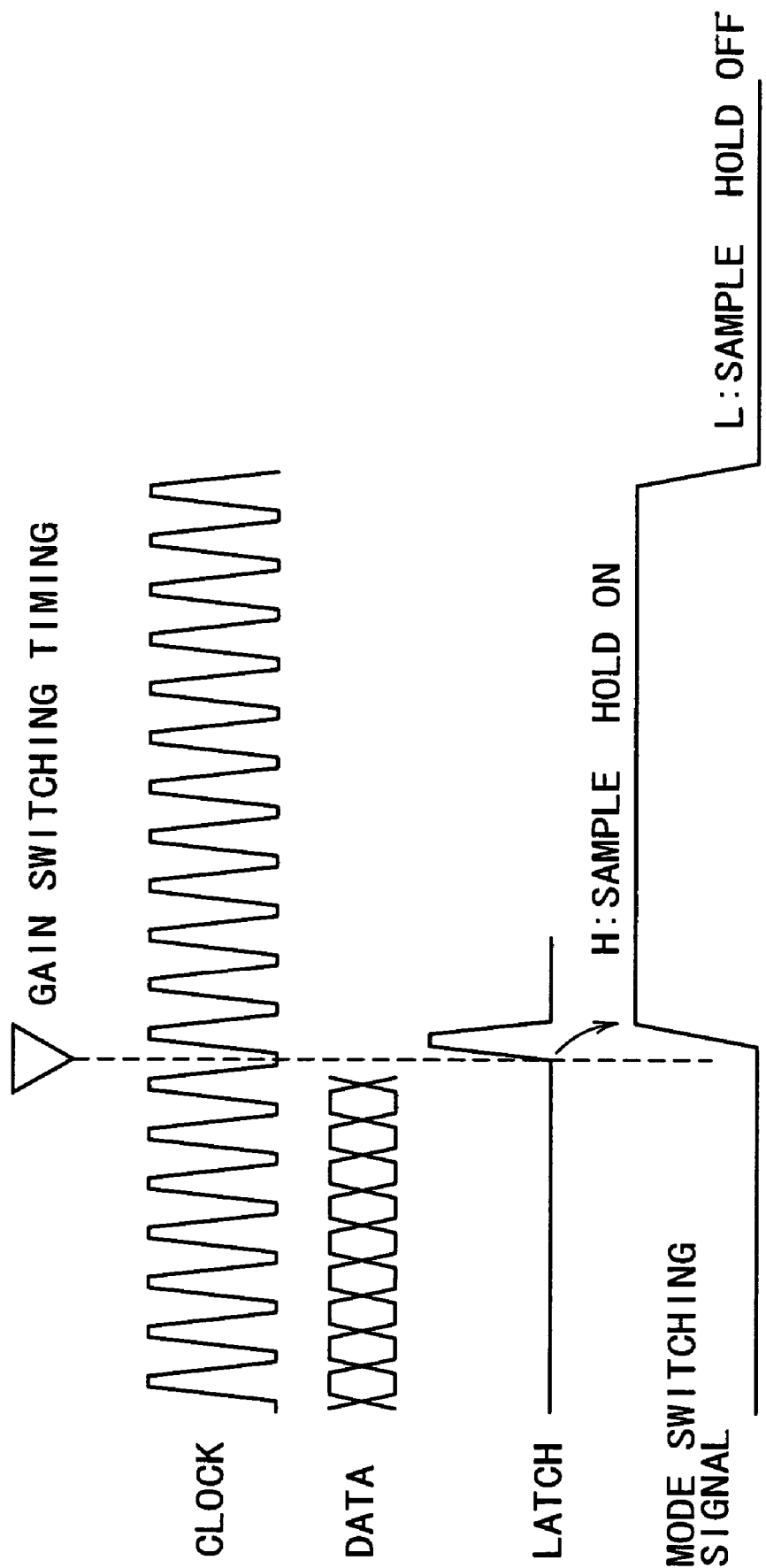
FIG. 4 is a timing chart for describing the timing used to switch between the sample mode and the hold mode of the sample-and-hold circuit of FIG. 3.

The mode switching signal for controlling the sample-and-hold circuit 23 is a one-shot signal, as shown in FIG. 4. The mode switching signal goes to the high level at the latch signal timing that serves as the gain switching timing. The mode switching signal then returns to low level after a certain length of time has elapsed.

Figure 5A:
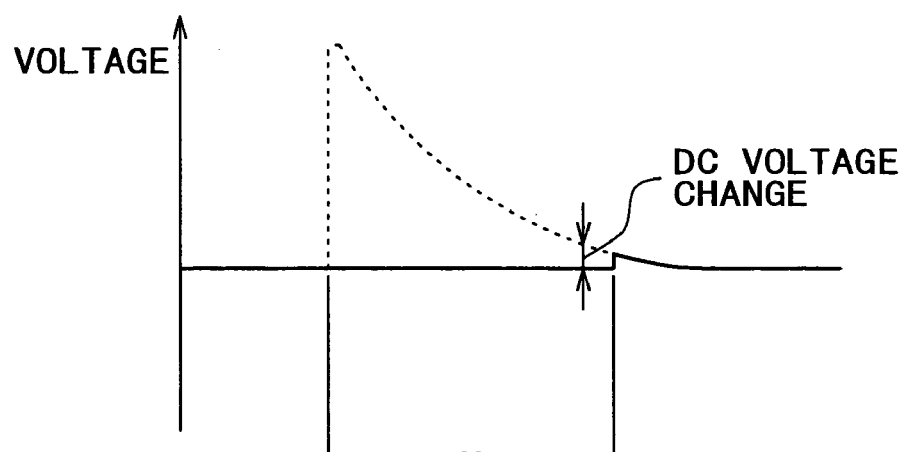
FIGS. 5A and 5B show how the DC voltage change is controlled in the cellular phone of the first embodiment, which occurs at the gain switching timing of the PGA circuit.
Figure 5B:
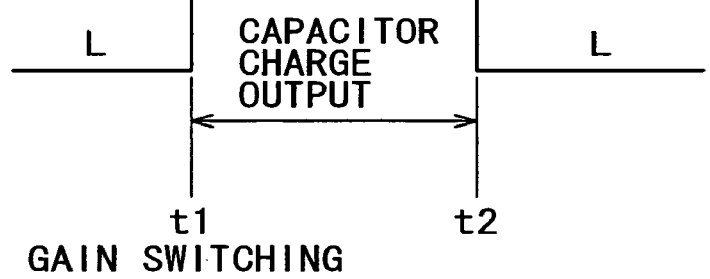

For example, when the gain is switched at the time t1 shown in FIG. 5B, a low-level mode switching signal was supplied to the switch 43 of the sample-and-hold circuit 23 shown in FIG. 3 until the time t1 is reached or the gain is switched.

As long as the low-level mode switching signal is supplied, the sample-and-hold circuit 23 is set to "sample" mode and the selector switch 43 turns on. This supplies the output signal from the PGA section 31 directly to the quadrature detection circuit 5 shown in FIG. 1 by way of the high input impedance buffer 44 and the output terminal 42.

Next, when the gain is switched at the time t1 shown in FIG. 5B, a high-level mode switching signal is supplied to the selector switch 43 of the sample-and-hold circuit 23 shown in FIG. 3, at the latch signal timing that serves as the gain switching timing.

When the high-level mode switching signal is supplied, the sample-and-hold circuit 23 is set to "hold" mode and the selector switch 43 turns off. This allows supplying the electric charge stored in the capacitor 45 to the quadrature detection circuit 5 shown in FIG. 1 by way of the high input impedance buffer 44 and the output terminal 42, instead of the signal output from the PGA section 31.

More specifically, when the gain is switched, the DC voltage level of the output signal from the PGA section 31 sharply rises immediately after the gain switching, as shown with a dotted line in FIG. 5A. The voltage level then gradually converges over time to the initial level. The gain control circuit 22 counts the time after the high-level mode switching signal was output and controls the mode switching signal to the low level when a specified length of time has elapsed after the output of the high-level mode switching signal was initiated, as shown after the time t2 in FIG. 5B. The time interval between the outputs of the high-level mode switching signal and low-level mode switching signal (between t1 and t2) is set to a time required for the DC voltage level that has risen sharply immediately after the gain switching, to converge back to the initial DC voltage level.

The DC voltage of the electric charge supplied from the capacitor 45 is nearly equal to the DC voltage of the output signal from the PGA section 31 during "sample" mode. The DC voltage of the electric charge stored in the capacitor 45 can therefore be output as the output signal from the PGA section 31, until the DC voltage level that has risen sharply immediately after the gain switching, converges back to the initial DC voltage level, or during the time between t1 and t2 shown in FIG. 5A.

The DC voltage change before and after gain switching can therefore be maintained at a nearly flat level as shown with a solid line in FIG. 5A. This allows the PGA circuit 4 to supply a stable DC output voltage to the quadrature detection circuit 5 and A/D converter 6 located in the latter stages downstream of the PGA circuit 4, to allow stable operation of the circuits in the latter stages downstream of the PGA circuit 4.

As explained above, in the cellular phone of the first embodiment of the present invention, the sample-and-hold circuit 23 of the PGA circuit 4 outputs a DC voltage stored in the capacitor 45 that is nearly equal to the DC voltage before a change occurs, instead of using an output signal whose DC voltage level greatly changes at the time of the gain switching.

With this method, the large change in DC voltage of the output signal from the PGA circuit 4, which occurs immediately after the gain is switched, can be eliminated. This allows the PGA circuit 4 to supply the output signal with a stable DC voltage level, so the latter-stage circuits can operate with high stability.

Furthermore, the DC voltage convergence time in the PGA circuit 4 can be reduced, and a speedier attack time for the PGA circuit can be achieved.

Since the electric charge can be output from the capacitor 45 during the DC voltage convergence time in the DC feedback circuit 32, the cutoff frequency for the DC feedback voltage 32 can be set without having to allow for the DC voltage convergence time. This means that the cutoff frequency for the DC feedback circuit 32 can be set to a sufficiently low value to prevent a lack of low frequency components in the input-to-output signal transfer characteristics of the PGA circuit 4. The PGA circuit 4 is in this way made an ideal baseband amplifier.

[Second Embodiment]

Figure 6:
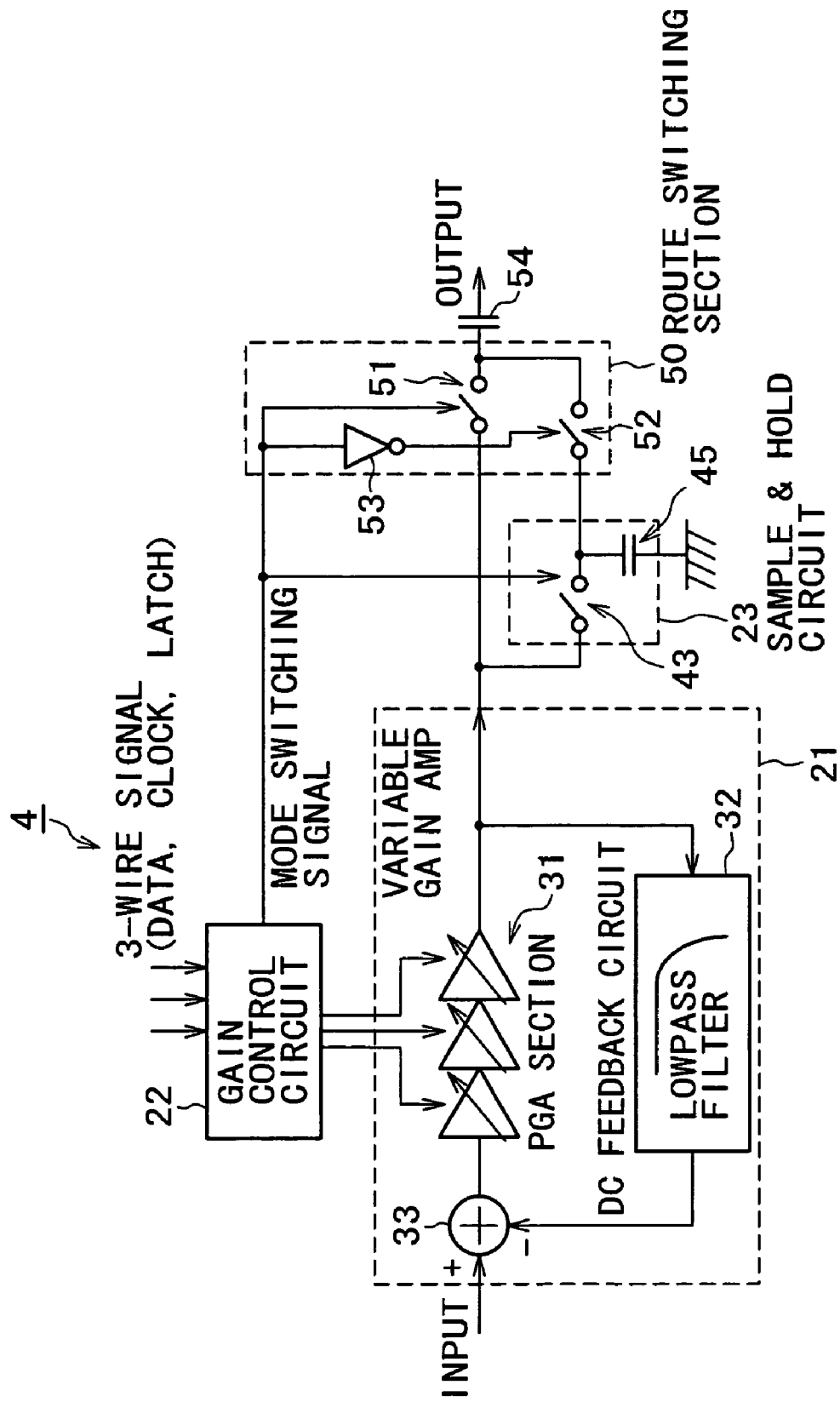
FIG. 6 is a block diagram showing the PGA circuit built into the cellular phone of a second embodiment of the present invention.
Figure 7:
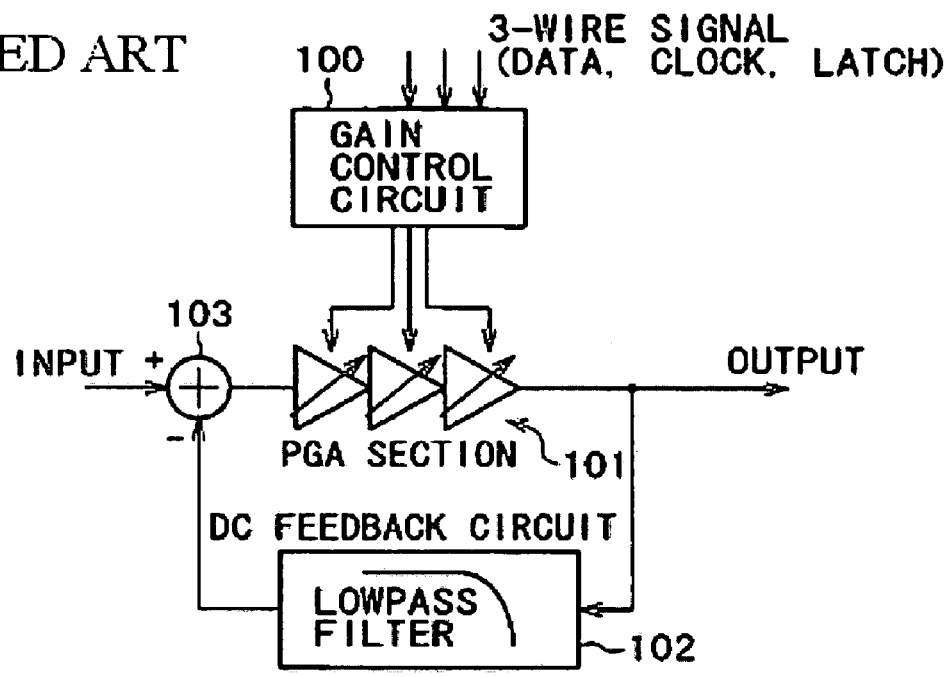
FIG. 7 is a block diagram showing a general PGA circuit.
Figure 8:
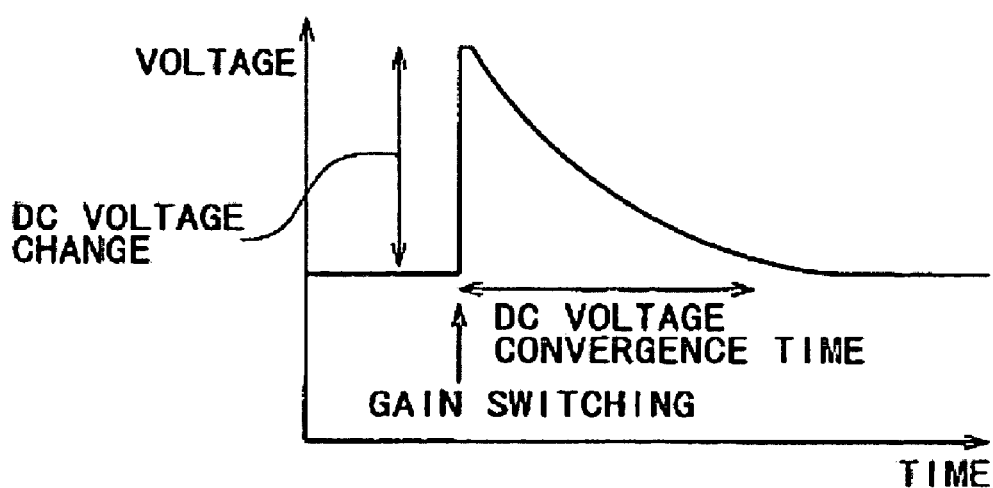
FIG. 8 shows how the DC voltage change occurs at the time of the gain switching in a general PGA circuit and also shows how the DC voltage change converges over time.
Figure 9:
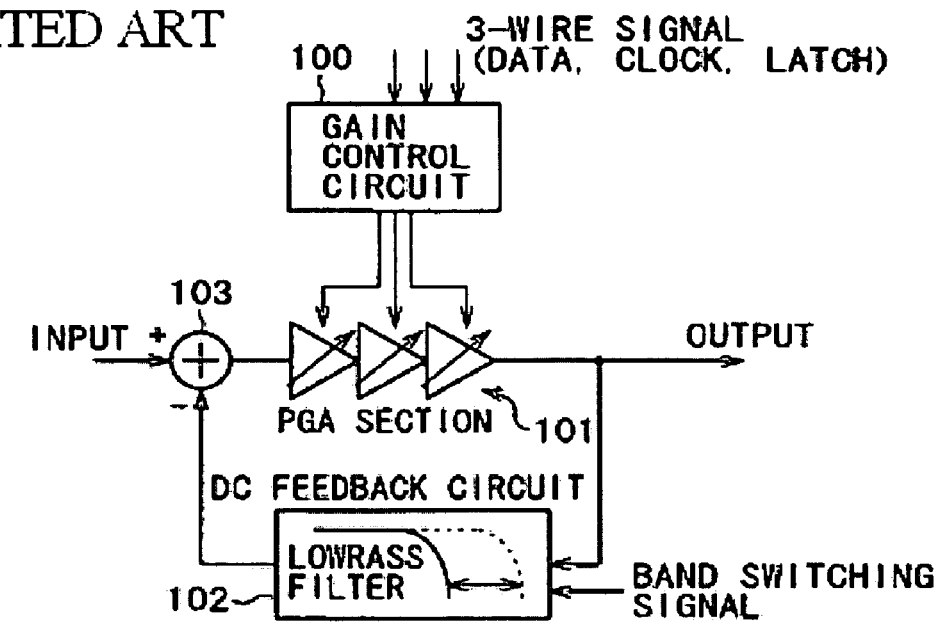
FIG. 9 is a block diagram showing a PGA circuit of the prior art that switches the cutoff frequency of the DC feedback circuit at the gain switching timing.
Figure 10:
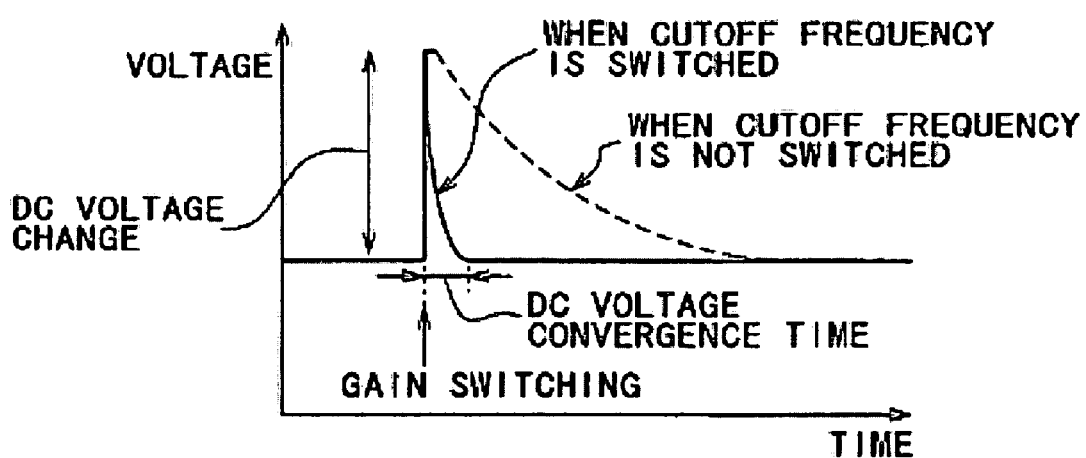
FIG. 10 shows a DC voltage change that occurs when the cutoff frequency is switched with the PGA circuit of FIG. 9 and also shows the DC voltage convergence time.

The second embodiment of the present invention is described next with another cellular phone. In this cellular phone of the second embodiment, the PGA circuit 4 comprises a path switching section 50 for switching between the output from the sample-and-hold circuit 23 and the output from the variable gain amplifier 21 as shown in FIG. 6.

The only point differing from the first embodiment is that the second embodiment contains this path switching section 50. The operations of all other sections are identical to those for the first embodiment so only the operation of the path switching section 50 is described to avoid redundant description.

The path switching section 50 installed into the PGA circuit 4 in the cellular phone of the second embodiment has a first selector switch 51 that turns the output signal from the variable gain amplifier 21 on or off and a second selector switch 52 that turns the output signal from the sample-and-hold circuit 23 on or off.

Each of the selector switches 51 and 52 is controlled with the mode switching signal output from the gain control circuit 22 at the latch signal timing. During this control, the mode switching signal is directly supplied to the first selector switch 51. The mode switching signal is supplied to the second selector switch 52 after the polarity is inverted by an inverter 53.

In this type of the PGA circuit 4, when the gain is switched, a high-level mode switching signal is then output from the gain control circuit 22 at the timing of the latch signal, as explained by using FIG. 4 and FIG. 5.

The selector switch 43 of the sample-and-hold circuit 23 turns off when this high-level mode switching signal is supplied. Then as explained previously, the electric charge stored in the capacitor 45 is supplied to the second selector switch 52 in the path switching section 50.

On the other hand, the mode switching signal is directly supplied to the first selector switch 51 in the path switching section 50. This mode switching signal is supplied to the second selector switch 52 after the polarity is inverted by the inverter 53.

The first selector switch 51 turns off when a high-level mode switching signal is supplied, and turns on when a low-level mode switching signal is supplied. This means that the first selector switch 51 is off and no output signal is available from the variable gain amplifier 21 during a specified period after the gain is switched, because the high-level mode switching signal is supplied during that period.

The second selector switch 52 turns off when a high-level mode switching signal is supplied, and turns on when a low-level mode switching signal is supplied, the same as for the first selector switch 51. However, when a high-level mode switching signal is output from the gain control circuit 22, then that high-level mode switching signal is converted to a low-level mode switching signal by the inverter 53 and is then supplied to the second selector switch 52.

Due to the above operation, the low-level mode switching signal is supplied during the specified period after the gain is switched, so the second selector switch 52 turns on during that period. The output signal from the sample-and-hold circuit 23 is then supplied to the quadrature detection circuit 5 shown in FIG. 1, by way of the capacitor 54 used for signal stabilization.

This eliminates the large DC voltage change occurring in the signal output from the PGA circuit 4 immediately after the gain is switched. The same effect as the above described first embodiment can therefore be obtained.

The above-mentioned embodiments are only examples for describing the present invention. The present invention therefore should not be interpreted as being limited to those embodiments, but may be embodied in other different forms depending on the design ideas without departing from the technical concept or spirit of the present invention.

As described above, the present invention allows controlling the large DC voltage change occurring at the gain switching timing of the variable gain amplifier.

What is claimed is:

1. A mobile communication terminal comprising:
   a variable gain amplifier means for amplifying a received signal with a controlled gain and outputting that amplified received signal;
   a gain control means for controlling the gain of said variable gain amplifier means and also for outputting a gain switching signal for a specified period at the gain switching timing of said variable gain amplifier means;
   an output switching means for outputting the received signal amplified by said variable gain amplifier means until said gain switching signal is supplied and then outputting a specified voltage signal instead of the received signal amplified by said variable gain amplifier means as long as said gain switching signal is being supplied;
   a feedback means for detecting direct current components in the received signal output from said variable gain amplifier means and outputting those direct current components after inverting the polarity; and
   an adder means for adding the direct current components with the polarity inverted by said feedback means, to the received signal supplied to said variable gain amplifier means.

2. A mobile communication terminal according to claim 1, with said output switching means comprising:
   a signal forming means for forming said specified voltage signal; and
   a switching means for switching between the received signal amplified by said variable gain amplifier means and the specified voltage signal fed from said signal forming means in accordance with said gain switching signal.

3. A mobile communication terminal device according to claims 1 or 2, wherein said gain control means outputs said gain switching signal until the value of the direct-current voltage generated immediately after the gain of said variable gain amplifier means is switched, converges back to the initial direct-current voltage value.

4. A variable gain circuit comprising:
   a variable gain amplifier means for amplifying a received signal with a controlled gain and outputting that amplified received signal;
   a gain control means for controlling the gain of said variable gain amplifier means and also for outputting a gain switching signal for a specified period at the gain switching timing of said variable gain amplifier means;
   an output switching means for outputting the received signal amplified by said variable gain amplifier means until said gain switching signal is supplied and then outputting a specified voltage signal instead of the received signal amplified by said variable gain amplifier means as long as said gain switching signal is being supplied;
   a feedback means for detecting a direct current component in the received signal output from said variable gain amplifier means and outputting this direct current component after inverting its polarity; and
   an adder means for adding the direct current component with polarity inverted by said feedback means, to the received signal supplied to said variable gain amplifier means.

5. A variable gain circuit according to claim 4 wherein said output switching means comprises:
   a signal forming means for forming said specified voltage signal; and
   a switching means for switching between the received signal amplified by said variable gain amplifier means and the specified voltage signal fed from said signal forming means in accordance with said gain switching signal.

6. A variable gain circuit according to claims 4 or 5, wherein said gain control means outputs said gain switching signal until the value of the direct-current voltage generated immediately after the gain of said variable gain amplifier means was switched, converges back to the initial direct-current voltage value.

7. A variable gain circuit comprising:
   a variable gain amplifier apparatus for amplifying a received signal with a plurality of amplifiers whose gain is independently controlled, and then outputting the amplified received signal;
   a gain control circuit for controlling the gain of each amplifier of said variable gain amplifier apparatus and outputting a gain switching signal for a specified period at the timing when the gain of said variable gain amplifier apparatus is switched;
   a capacitor for outputting a specified voltage signal;
   an output selector switch for outputting the received signal amplified by said variable gain amplifier apparatus until said gain switching signal is supplied, and then outputting the electric charge stored in said capacitor as the specified voltage signal instead of the received signal amplified by said variable gain amplifier apparatus as long as said gain switching signal is being supplied;
   a feedback for detecting a direct current component in the received signal output from said variable gain amplifier apparatus and outputting this direct current component after inverting its polarity; and
   an adder for adding the direct current component with polarity inverted by said feedback, to the received signal supplied to said variable gain amplifier apparatus.

* * * * *